(12) United States Patent
Tomita

(10) Patent No.: US 8,148,893 B2
(45) Date of Patent: Apr. 3, 2012

(54) SUBSTRATE FOR ORGANIC ELECTROLUMINESCENCE DEVICE AND METHOD OF PRODUCING THE SAME

(75) Inventor: Taiji Tomita, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 216 days.

(21) Appl. No.: 12/186,332

(22) Filed: Aug. 5, 2008

(65) Prior Publication Data
US 2009/0039778 A1    Feb. 12, 2009

(30) Foreign Application Priority Data
Aug. 8, 2007 (JP) ................. 2007-206050

(51) Int. Cl.
*H01L 51/52* (2006.01)
(52) U.S. Cl. ............ 313/504; 313/512; 445/24; 445/25; 428/690
(58) Field of Classification Search .......... 313/504, 313/512; 428/690; 445/24–25; 257/40
See application file for complete search history.

(56) References Cited

U.S. PATENT DOCUMENTS

| | | | | |
|---|---|---|---|---|
| 7,019,455 B2* | 3/2006 | Fukuoka et al. | ............ | 313/504 |
| 2002/0185967 A1* | 12/2002 | Friend | ............ | 313/504 |
| 2003/0227253 A1* | 12/2003 | Seo et al. | ............ | 313/504 |
| 2004/0021413 A1* | 2/2004 | Ito et al. | ............ | 313/504 |
| 2004/0096697 A1* | 5/2004 | Tai et al. | ............ | 428/690 |
| 2004/0119066 A1* | 6/2004 | Han et al. | ............ | 257/40 |
| 2004/0140759 A1* | 7/2004 | Park et al. | ............ | 313/504 |

FOREIGN PATENT DOCUMENTS

| | | |
|---|---|---|
| JP | 2001-351779 | 12/2001 |
| JP | 2005-63959 | 3/2005 |
| JP | 2007227127 A * | 9/2007 |

OTHER PUBLICATIONS

English translation of JP 2007227127A, published Sep. 6, 2007.*
Masuichi et al., "30.1: New Nozzle-printing Method for Large-Size Organic El Device," *SID 05 Digest*, Dainippon Screen MFG. Co., Ltd., Japan, pp. 1192-1195, 2005.

* cited by examiner

*Primary Examiner* — Peter Macchiarolo
*Assistant Examiner* — Mary Ellen Bowman
(74) *Attorney, Agent, or Firm* — Fitzpatrick, Cella, Harper & Scinto

(57) ABSTRACT

Provided is a substrate for an organic electroluminescence device having the following characteristics: occurrence of withdrawal of an organic electroluminescence material can be suppressed, and, even when the withdrawal occurs owing to, for example, impurities on the substrate, such a problem that stop of film formation for one entire line can be suppressed, and hence yields can be improved. The substrate for an organic electroluminescence device including at least pixel electrodes and stripe-shaped banks has projections between the stripe-shaped banks.

7 Claims, 6 Drawing Sheets

SUBSTRATE FOR ORGANIC ELECTROLUMINESCENCE DEVICE AND METHOD OF PRODUCING THE SAME

BACKGROUND OF THE INVENTION

1. Field of the Invention

The present invention relates to a substrate for an organic electroluminescence (EL) device and a method of producing the substrate, an organic EL device, and a display apparatus including the organic EL device.

2. Description of the Related Art

An organic EL device is a device having an emission layer formed of an organic low-molecular weight compound or organic polymer having an EL light emission ability. The organic EL device has, for example, the following characteristics ideal for a display device: the device has a wide view angle because the device is of a selfluminous type, and the device is excellent in impact resistance. Accordingly, researches and developments have been conducted on the device in various fields.

The method for the production of the device, which has been widely studied, is, for example, a vacuum vapor deposition method, an ink-jet method, or a printing method. In a nozzle printing method using solutions each prepared by dissolving an organic EL material in a liquid (SID 05 Digest p. 1192), banks each formed of an organic material on a substrate are subjected to liquid-repellent processing with fluorine plasma generated in a vacuum apparatus so that the liquid organic EL materials are applied in isolation from each other.

In such applying apparatus that continuously applies the liquid organic EL materials, patterning is generally performed by applying each of the liquid organic EL materials between adjacent stripe-shaped banks.

However, such stripe-shaped bank involves the following problem: a solution (liquid organic EL material) diffuses toward the outside of the bank owing to a capillary phenomenon when the solvent of the solution has a small surface tension, or the solution is repelled by the bank so as to be withdrawn into the bank when the solvent of the solution has a large surface tension.

Meanwhile, a solvent having somewhat low volatility must be used for a liquid organic EL material in such application-based apparatus in order that the clogging of an orifice for applying the material due to the drying of the solvent may be suppressed or the planarity of a film formed of the material at the time of the formation of the film may be improved. However, it has been generally known that a solvent having low volatility has a large surface tension, so the withdrawal of the solvent becomes of more serious concern than a solvent having high volatility does. Japanese Patent Application Laid-Open No. 2005-63959 discloses that a diffusion preventing portion is provided for each of the start edge portion and end edge portion of a stripe-shaped bank.

However, merely closing the start edge portion and end edge portion of the bank may be unable to hold a liquid organic EL material at each of the start edge portion and end edge portion of the bank at the time of the application of the material. In addition, the presence of an impurity in the bank involves the following problem: the withdrawal of the material occurs at the position where the impurity is present as an origin, with the result that a film cannot be formed from the material on one entire line.

SUMMARY OF THE INVENTION

It is an object of the present invention to provide a substrate for an organic EL device having the following characteristics: occurrence of withdrawal of an organic EL material can be suppressed, and, even when the withdrawal occurs owing to, for example, impurities on the substrate, such a problem that stop of one entire line for film formation can be suppressed, and hence yields can be improved. Another object of the present invention is to provide a method of producing the substrate for an organic EL device, an organic EL device using the substrate for an organic EL device, and a display apparatus including the organic EL device.

As means for solving the above-mentioned problems, the present invention provides a substrate for an organic EL device including pixel electrodes, stripe-shaped banks and projections provided between the stripe-shaped banks.

According to the present invention, a projection formed between stripe-shaped banks contacts a liquid organic EL material to improve holding performance for the solution, whereby the occurrence of the withdrawal of the material can be suppressed. Moreover, even when the withdrawal occurs owing to, for example, an impurity on a substrate, a problem referred to as inability to form a film from the material on one entire line can be suppressed, so the yield in which the film is formed can be improved.

Further features of the present invention will become apparent from the following description of exemplary embodiments with reference to the attached drawings.

DESCRIPTION OF THE EMBODIMENTS

Figure 1:
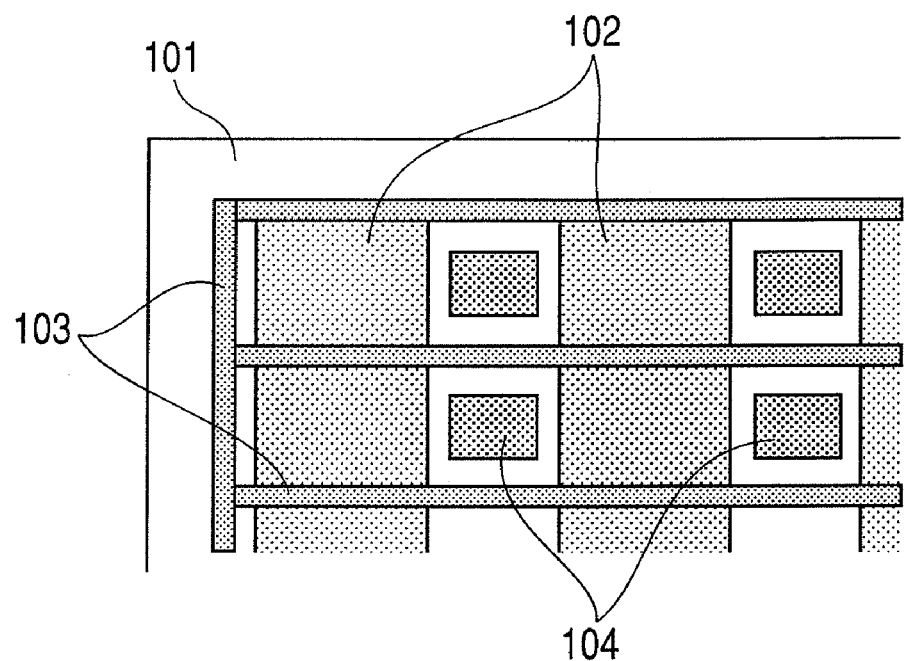
FIG. 1 is an outline plan view of a substrate for an organic EL device in the present invention.

Hereinafter, a substrate for an organic EL device, an organic EL device, and a method of producing a display apparatus including an organic EL device according to the present invention will be described.

Embodiment 1

First, reference numerals in FIGS. 1 to 11 will be described.

Reference numeral 101 represents a substrate; 102, a pixel electrode; 103, a bank; 104, a projection; 105, a (liquid) organic EL material; 2, a hole injection layer; 3, an emission layer; 4, an electron injection layer; 5, a cathode; 601, a scanning signal driver; 602, an information signal driver; 603, a current supply source; 701, a gate selection line; 702, an information signal line; 703, a current supply line; 801, a first transistor; 802, a second transistor; 803, a capacitor; 804, an organic EL device; 901, a polysilicon layer; 902, a gate insulation film; 903, a gate electrode; 904, a drain electrode; 905, a source electrode; 906, an insulation layer; and 907, a contact hole.

FIG. 1 is a schematic view of part of a substrate for an organic EL device of the present invention.

The substrate 101 is not particularly limited as long as the substrate has high transparency. For example, a film made of an inorganic material such as glass or of an organic material such as a transparent resin is used as the substrate.

The pixel electrodes 102 corresponding to respective colors are arranged on the substrate 101. The stripe-shaped banks 103 are formed so as to sandwich the pixel electrodes 102, and, furthermore, the banks 103 are formed so as to connect the start edges and end edges of the adjacent banks 103.

The projections 104 are provided between the adjacent stripe-shaped banks 103. As shown in FIG. 1, the projections 104 are formed in regions between the banks 103 except pixel portions in order that an opening ratio may be maintained and an influence of the projections on the thickness unevenness of a liquid organic EL material may be reduced.

A resin material or the like is used as a material for each of the banks 103 or as a material of which each of the projections 104 is formed. A method involving performing photolithography while providing the resin material itself with photosensitivity, a printing method, or the like is employed as a patterning method for the formation of each of the banks and the projections. Although a material of which each of the projections 104 is formed may be different from a material for each of the banks 103, in the optimum case, each of the projections is preferably formed of the same material as that for each of the banks 103 by the same step as that for each of the banks because of the simplicity of the formation.

The total length of each of the projections 104 in the direction perpendicular to its adjacent bank 103 is preferably 90% or less, or more preferably 70% or less of a length between the stripe-shaped banks 103 sandwiching the projection. The constitution is intended for the suppression of the following phenomenon: liquid organic EL materials stranding on the projections 104 exceed the banks 103 so that color mixture occurs between plural lines. The length of each of the projections 104 preferably falls within the above range because the possibility that the color mixture occurs increases when the length exceeds the above range, though the preferable range varies depending on, for example, a liquid organic EL material to be applied and a condition under which the material is applied.

Figure 2:
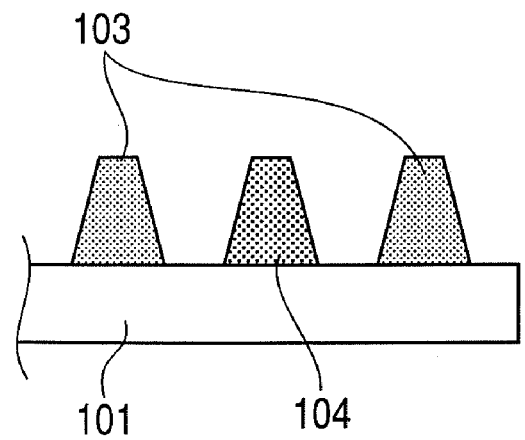
FIG. 2 is an outline sectional view of the substrate for an organic EL device shown in FIG. 1.

FIG. 2 is a schematic view of part of the substrate shown in FIG. 1 in a sectional direction.

The height of each of the projections 104 is preferably comparable to that of each of the banks 103. When the height of each of the projections 104 is comparable to that of each of the banks 103, the projections and the banks can be formed by the same step, so a production process for the substrate can be additionally simplified.

It should be noted that each of the projections 104 in the present invention aims to achieve the following object: each of the projections contacts a liquid organic EL material to improve holding performance for the solution so that the withdrawal of the liquid organic EL material is suppressed. As long as an effect similar to that described above is obtained, a material for each of the projections, the shape of each of the projections, a production step for each of the projections, and the like are not limited to those of the present invention.

It is important that the surface of each of the banks 103 and the projections 104 be made liquid-repellent in order that film formability may be improved. The surface can be made liquid-repellent by, for example, a method involving mixing a material for each of the banks and the projections with a liquid-repellent agent or a method involving subjecting the banks 103 and the projections 104 to a liquid-repellent treatment after the formation of the banks and the projections. A known method for the liquid-repellent treatment is a method based on a plasma treatment in which fluorine or a gas containing a fluorine compound is introduced or a method involving forming a liquid-repellent agent such as an organic silicon compound, a fluorine-containing silicon compound, or an organofluoric compound into a film by a vacuum film formation method or application method.

Figure 3:
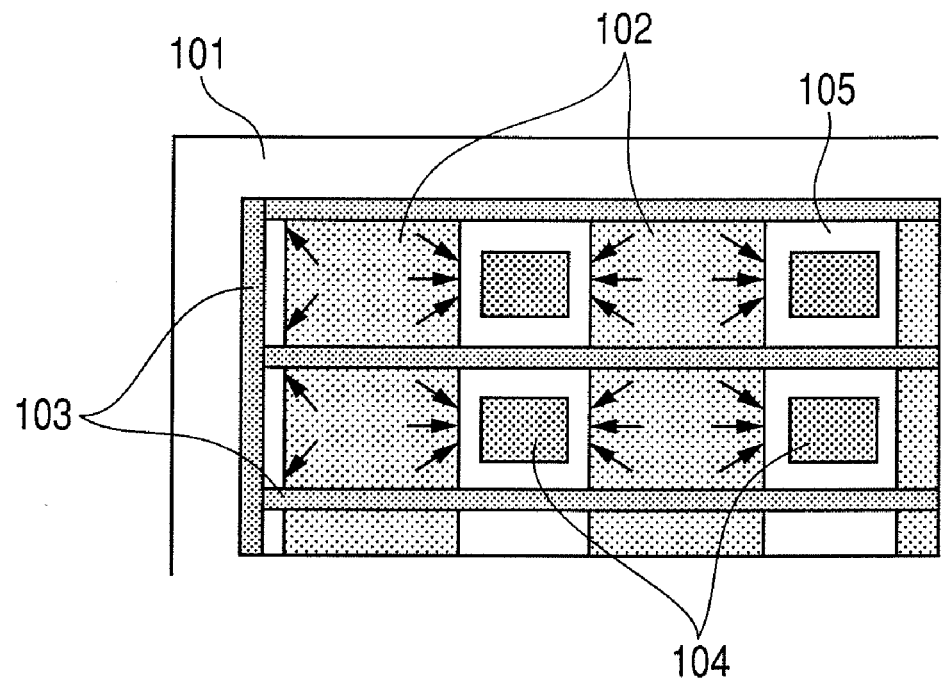
FIG. 3 is an image view illustrating a state where an organic EL material is applied onto the substrate for an organic EL device shown in FIG. 1.

A liquid organic EL material is continuously applied with an applying apparatus that continuously applies the material such as a dispenser between the adjacent stripe-shaped banks 103 of the substrate for an organic EL device having the above constitution. As a result, as shown in FIG. 3, the liquid organic EL material 105 is formed into a film, whereby at least one organic layer is formed. Arrows in the pixel electrodes 102 shown in FIG. 3 visualize surface tensions applied to the liquid organic EL materials 105, the banks 103, and the projections 104; it can be shown that the presence of the projections 104 improves holding performance for the liquid organic EL materials 105. Therefore, the occurrence of the withdrawal of the organic EL materials 105 can be suppressed, and, even when the withdrawal occurs owing to, for example, an impurity on the substrate 101, a problem referred to as inability to form a film from any such material on one entire line can be suppressed, so the yield in which the film is formed can be improved.

Figure 4:
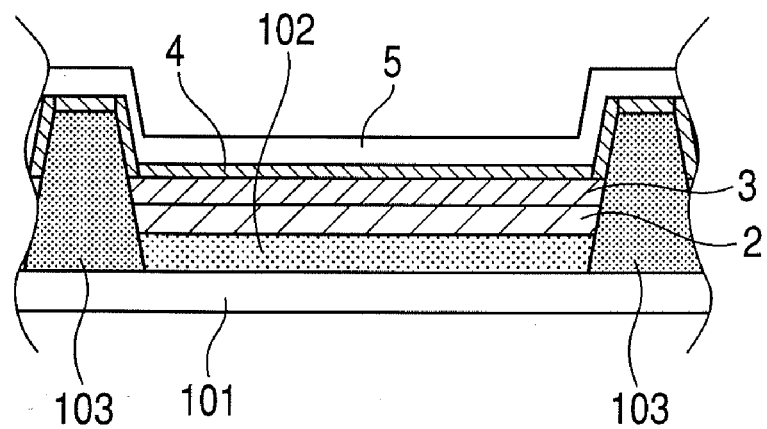
FIG. 4 is an outline sectional view illustrating a state where an organic EL device is produced on the substrate for an organic EL device shown in FIG. 1.

FIG. 4 is a schematic view illustrating an example in which an organic EL device is produced on the substrate for an organic EL device according to the present invention, and the device is viewed from a sectional direction. The hole injection layer 2 and the emission layer 3 are formed as organic layers between the adjacent banks 103. Here, the hole injection layer 2 and the emission layer 3 are each formed by the application of a material for each of the layers with an applying apparatus that continuously applies the material such as a dispenser. Further, the electron injection layer 4 and the cathode 5 are each formed on the layers by a vacuum vapor deposition method.

Any material can be used in the hole injection layer 2 as long as the material has hole transport property, and PEDOT: PSS that is widely used in application type organic EL devices can be utilized. However, a material to be used in the layer is not particularly limited to the material.

Any material can be used in the emission layer 3 as long as the material has an EL light emission ability. Although a polymer material is widely used in application type organic EL devices, a material to be used in the layer may be any one of the polymer material, a low-molecular weight material, and an oligomer material. A polyparaphenylene vinylene derivative, a polyfluorene derivative, or the like can be utilized as the polymer material. However, the material to be used in the layer is not particularly limited to any such derivative.

Any one of, for example, the fluorides, carbonates, and oxides of alkali metals and alkaline earth metals such as LiF, $CsCO_3$, and CaO can be utilized in the electron injection layer 4. Further, the present invention can be achieved even with an organic compound having electron transport property. However, a material to be used in the layer is not particularly limited to the foregoing.

Aluminum can be generally utilized in the cathode 5. However, a material to be used in the cathode is not particularly limited to aluminum.

An organic EL device is produced as described above. After that, the device except an extraction electrode is sealed with a glass cap or a protective film such as an $SiN_x$.

A device constitution shown in FIG. 4 is the most general device constitution in an application type organic EL device, but its layer constitution is not particularly limited to that of the present invention. A device formed of a liquid organic EL material may adopt a one-layer constitution formed of an organic EL layer or a two-layer constitution formed of a hole injection layer and an organic EL layer. Alternatively, the device may adopt any other constitution such as a three-layer constitution formed of a hole injection layer, a hole transport layer, and an organic EL layer, a three-layer constitution formed of a hole injection layer, an organic EL layer, and an electron transport layer, or a four-layer constitution formed of a hole injection layer, a hole transport layer, an organic EL layer, and an electron transport layer. The device constitution is not particularly limited to the foregoing when a functional material is applied between stripe-shaped banks.

The substrate for an organic EL device of the present invention may adopt the following constitution, and an organic EL device of the present invention can be similarly achieved by using such substrate for an organic EL device.

Embodiment 2

Figure 5:
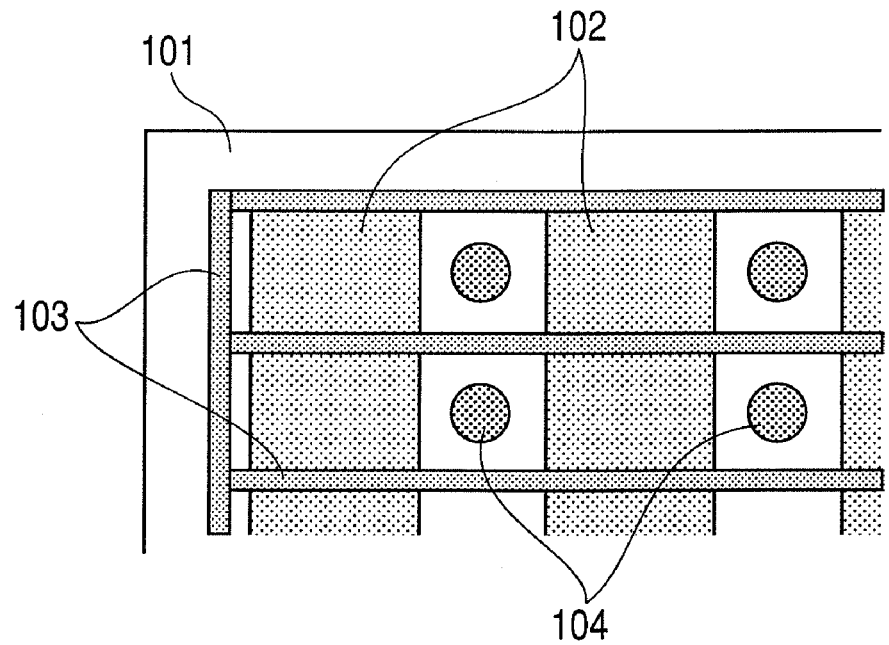
FIG. 5 is an outline plan view of another substrate for an organic EL device in the present invention.

FIG. 5 is a schematic view of part of the substrate for an organic EL device in another embodiment. As in the shown example, the side surface of each of the projections 104 is preferably a curved surface in order that an influence of the projections 104 on the thickness unevenness of a liquid organic EL material may be reduced. In this case, each of the projections 104 preferably adopts a circular or elliptical shape when viewed from above. However, the shape and curvature of each of the projections are not limited to those of the present invention as long as an effect similar to that described above can be obtained.

Figure 6:
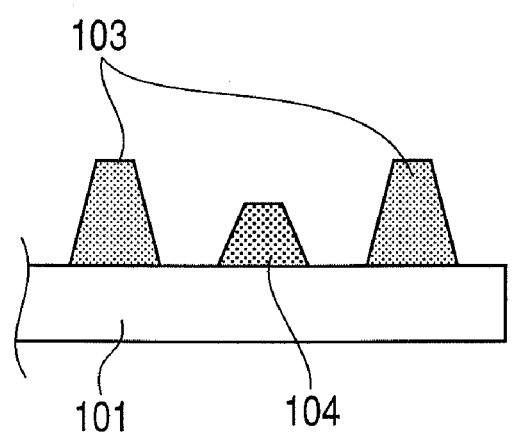
FIG. 6 is an outline sectional view of the substrate for an organic EL device shown in FIG. 5.

FIG. 6 is a schematic view of part of the substrate shown in FIG. 5 in a sectional direction. The height of each of the projections 104 can be made lower than that of each of the banks 103 by changing the shape of each of the projections 104 or a condition under which photolithography for the formation of the projections is performed. In this case, the following phenomenon can be suppressed: liquid organic EL materials stranding on the projections 104 exceed the banks 103 so that color mixture occurs between plural lines.

Embodiment 3

Figure 7:
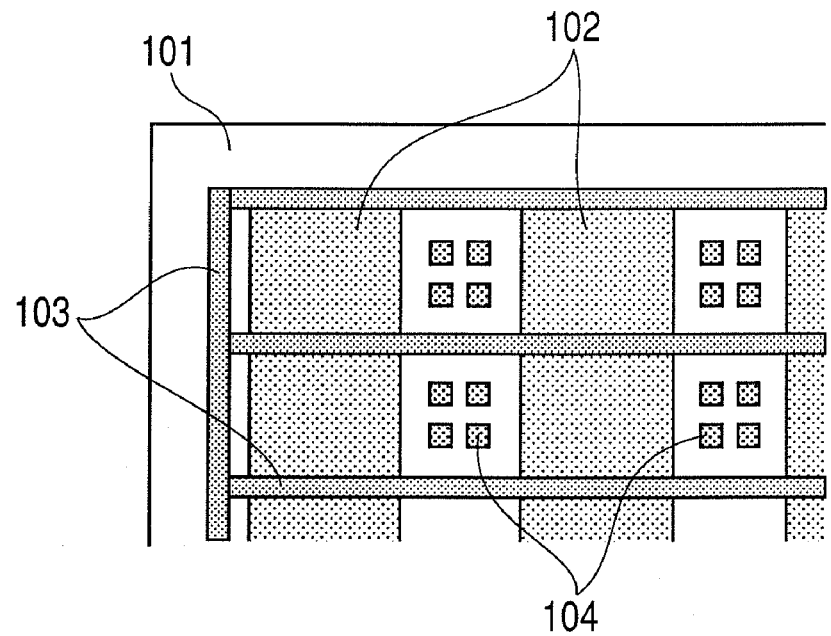
FIG. 7 is an outline plan view of another substrate for an organic EL device in the present invention.

FIG. 7 is a schematic view of part of the substrate for an organic EL device in another embodiment. As in the shown example, a plurality of the projections 104 is preferably formed in a region surrounded by the adjacent stripe-shaped banks 103 and adjacent pixels. In this case, the area of a surface in contact with a liquid organic EL material can be increased. Further, the following phenomenon can be suppressed: liquid organic EL materials stranding on the projections 104 exceed the banks 103 so that color mixture occurs between plural lines.

Embodiment 4

Figure 8:
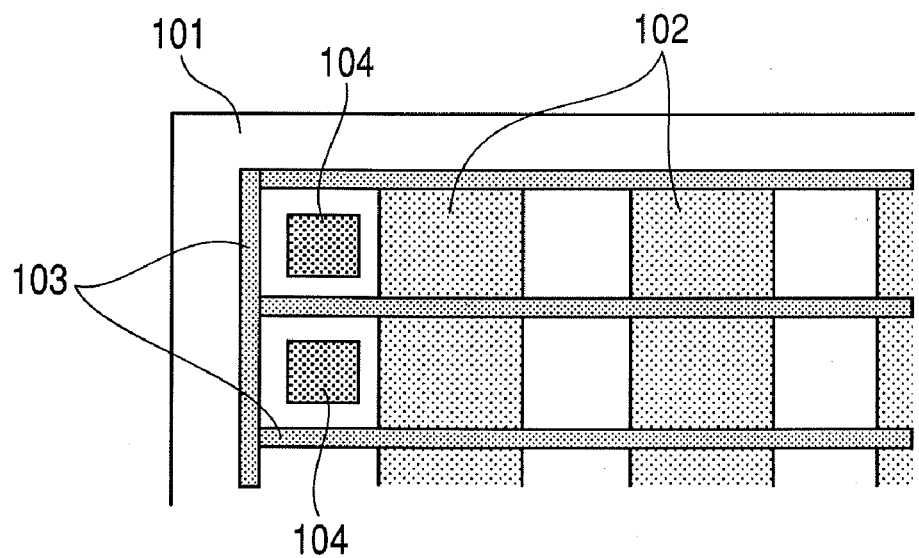
FIG. 8 is an outline plan view of another substrate for an organic EL device in the present invention.

FIG. 8 is a schematic view of part of the substrate for an organic EL device in another embodiment. As in the shown example, the projections 104 are formed at the start edge portions and end edge portions of the stripe-shaped banks 103, whereby holding performance for a solution, that is, a liquid organic EL material at the time of each of the initiation and completion of the formation of a film from the solution on one line can be improved.

Embodiment 5

Next, a display apparatus using the organic EL device of the present invention will be described.

The display apparatus of the present invention may be of a passive matrix driving type or an active matrix driving type.

Hereinafter, an example in which an active matrix substrate is used in the display apparatus of the present invention will be described with reference to FIGS. 9 to 11.

Figure 9:
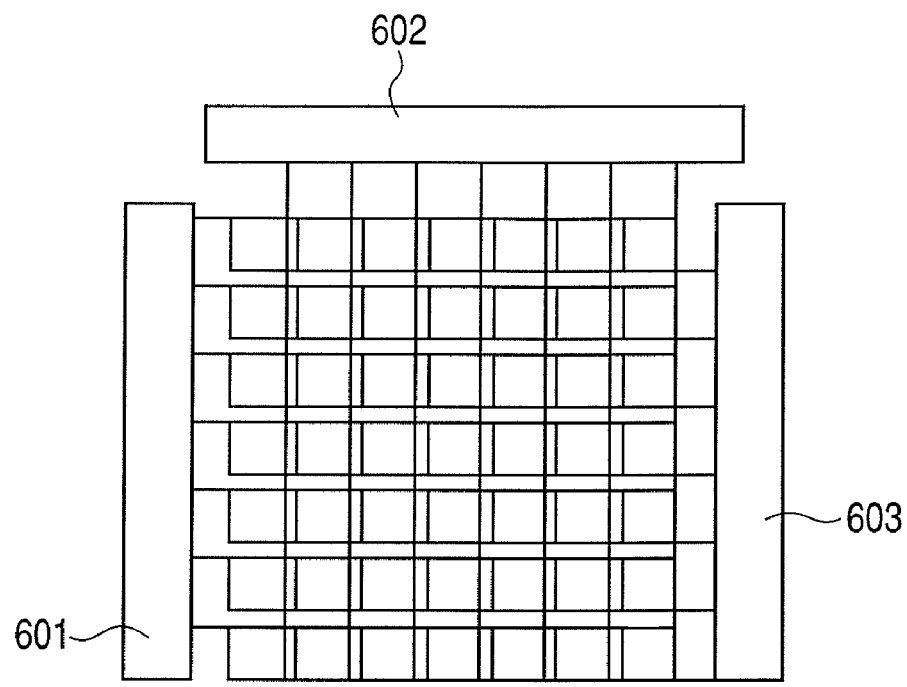
FIG. 9 is a schematic view illustrating an example of the constitution of a display apparatus including an organic EL device in the present invention and a drive unit.

FIG. 9 is a schematic view illustrating an example of the constitution of a display apparatus including the organic EL device of the present invention and a drive unit. FIG. 10 is a schematic view illustrating an example of a pixel circuit of the display apparatus of the present invention.

Figure 10:
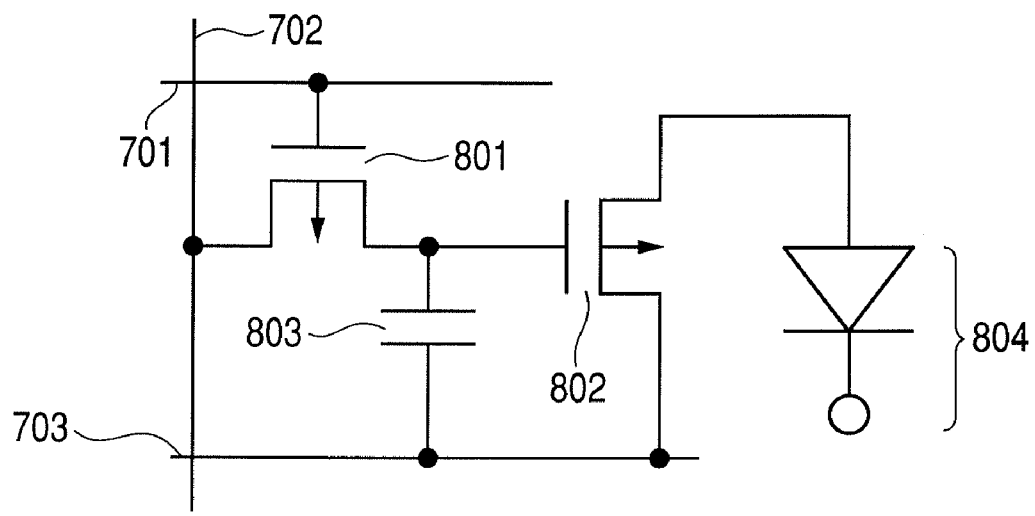
FIG. 10 is a schematic view illustrating an example of a pixel circuit of a display apparatus of the present invention.

The scanning signal driver 601, the information signal driver 602, and the current supply source 603 are arranged in the display apparatus, and are connected to the gate selection line 701, the information signal line 702, and the current supply line 703 shown in FIG. 10, respectively for each pixel. The pixel circuit shown in FIG. 10 is arranged at a point of intersection of the gate selection line 701 and the information signal line 702. The scanning signal driver 601 sequentially selects the gate selection line 701, and an image signal is applied from the information signal driver 602 in synchronization with the selection.

Next, the operation of the pixel circuit will be described. The pixel circuit shown in FIG. 10 includes the first transistor 801, the second transistor 802, and the capacitor 803. When a selection signal is applied to the gate selection line 701, the first transistor 801 is turned on, and an image signal is supplied to the capacitor 803 so that the gate potential of the second transistor 802 is determined. A current is supplied from the current supply line 703 to the organic EL device 804 in association with the gate potential of the second transistor 802. The current continues to flow in the organic EL device 804 until the next scanning is performed because the gate potential of the second transistor 802 is held in the capacitor 803 until the first transistor 801 is scanned and selected for the next time. Thus, the device can be caused to emit light at all times during a one-frame period.

Figure 11:
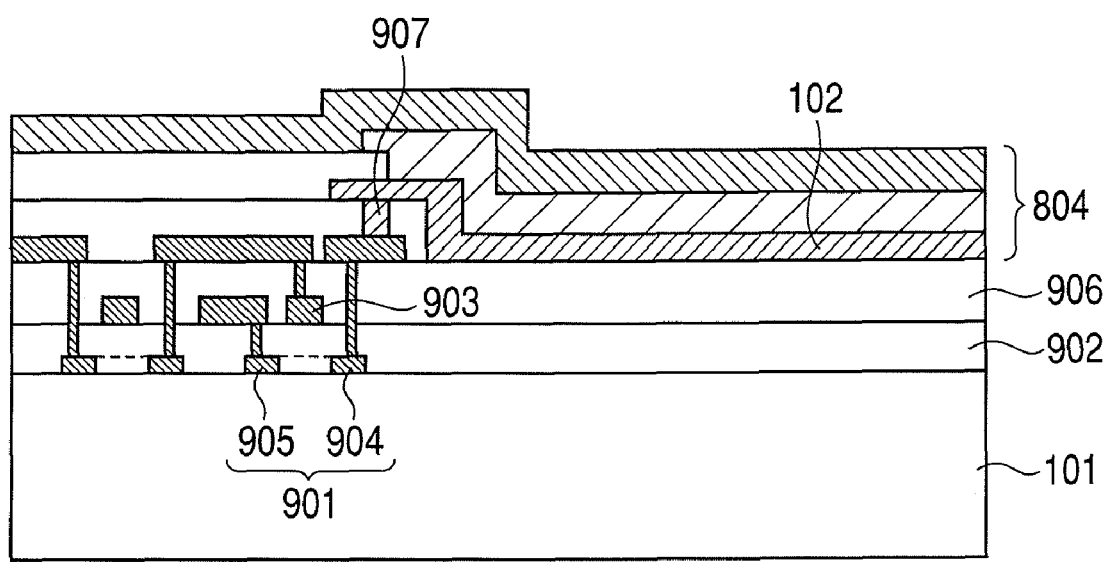
FIG. 11 is a schematic view illustrating an example of part of the sectional structure of the display apparatus of the present invention.

FIG. 11 is a schematic view illustrating an example of part of the sectional structure of the display apparatus of the present invention. The polysilicon layer 901 is provided on the substrate 101, and is doped with an appropriate impurity. The gate electrode 903 is provided on the layer through the gate insulation film 902, and the drain electrode 904 and the source electrode 905 to be connected to a drain region and a source region, respectively are formed. The insulation layer 906 and the anode 102 are formed on the electrodes, and the anode 102 and the drain electrode 904 are connected to each other through the contact hole 907. After that, the organic EL device 804 is formed on the anode 102.

The present invention is not particularly limited to a polysilicon substrate, and is easily applicable to, for example, a single-crystal silicon substrate or an amorphous silicon substrate.

Example 1

Hereinafter, the present invention will be described more specifically by way of examples. As shown in FIG. 1, the pixel electrodes 102 each formed of ITO were formed in a display region on the substrate 101 formed of glass by a sputtering method.

Further, the banks 103 each formed of a photosensitive polyimide material (Photonees (registered trademark) manufactured by Toray Industries, Inc.) were formed by photolithography. To be specific, the photosensitive polyimide material was applied onto the glass substrate 101, and was formed into a film with a spin coater at an initial number of revolutions of 500 rpm for 10 seconds and at a secondary number of revolutions of 1,500 rpm for 30 seconds. After having been formed, the film was baked with a hot plate at 120° C. for 3 minutes. After having been baked, the film was subjected to exposure and development with a photomask in which a pattern had been formed. A light exposure was 150 mJ, and the development was performed for 40 seconds by using a 2.38% TMAH solution. After having been dried, the film was cured in a clean oven at 230° C. for 30 minutes.

The height of each of the banks 103 was 3 μm, the width of each of the banks 103 was 30 μm, and a width between the adjacent banks 103 was 200 μm. In addition, the number of stripe-shaped pixel lines sandwiched between the adjacent banks 103 was 100.

A pattern for forming the projections 104 was arranged on the same photomask as the photomask for forming the banks 103, and the projections 104 were formed simultaneously with the step of forming the banks 103. The height of each of the projections 104 was 3 μm, the total length of each of the projections in the direction perpendicular to its adjacent bank 103 was 140 μm, and the total length of each of the projections in the direction horizontal to its adjacent bank 103 was 70 μm.

Next, the resultant was subjected to a UV/ozone treatment for 10 minutes in order that residual organic matter at the time of the formation of the banks 103 might be removed. An $O_2$ plasma treatment or the like may be performed for removing the residual organic matter.

Next, liquid repellency was imparted to the banks 103 and the projections 104 simultaneously by performing a fluorine plasma treatment with a $CF_4$ gas. To be specific, conditions for the $CF_4$ plasma treatment were as follows: a plasma power of 150 W and a flow rate of a methane tetrafluoride gas of 80 ml/min. It should be noted that a gas for the treatment is not limited to the methane tetrafluoride gas, and any other fluorocarbon-based gas may be used.

PEDOT/PSS was continuously applied as a hole injection material with a dispenser apparatus to a space between the adjacent stripe-shaped banks 103 where some of the projections 104 had been formed. The material was baked with a hot plate at 200° C. for 30 minutes, whereby a hole injection layer having a thickness of 30 nm was formed. Conditions for the application were as follows: the material was continuously applied with a Teflon (registered trademark)-coated metal needle having an aperture of 80 μm in the atmosphere while a distance between the needle and the substrate 101 was 30 μm and the velocity of the needle relative to the substrate 101 was 450 mm/sec.

Next, a solution prepared by dissolving a polyparaphenylene vinylene derivative poly[2-methoxy,5-(2'-ethylhexoxy)-1,4-phenylene vinylene] in tetralin at a concentration of 1 wt % was similarly applied to a space between the adjacent banks 103. After having been applied, the solution was baked with a hot plate at 150° C. for 10 minutes, whereby an organic EL layer having a thickness of 100 nm was formed. Conditions for the application were as follows: the solution was continuously applied with a Teflon (registered trademark)-coated metal needle having an aperture of 80 μm in nitrogen while a distance between the needle and the substrate 101 was 30 μm and the velocity of the needle relative to the substrate 101 was 300 mm/sec.

After that, $Cs_2CO_3$ was deposited to serve as an electron injection layer having a thickness of 3 nm with a vacuum vapor deposition apparatus, and Al was deposited to serve as an upper electrode having a thickness of 150 nm with the apparatus.

The resultant was transferred from a vacuum into nitrogen, and a glass cap containing a moisture absorbent was bonded so as to cover a pixel portion, whereby an organic EL device was produced.

A DC voltage was applied to the organic EL device thus obtained while ITO was used as a positive electrode and Al was used as a negative electrode. As a result, the device was observed to emit red EL light. The current efficiency of the EL emitted light was 1.5 cd/A when the device was driven at 5 V.

Example 2

An organic EL device was produced in the same manner as that described above except that only the pattern of the projections 104 of Example 1 was changed as shown in FIG. 5. Each of the projections 104 had a height of 2.8 μm, and was of a circular shape having a diameter of 100 μm.

Example 3

An organic EL device was produced in the same manner as that described above except that only the pattern of the projections 104 of Example 1 was changed as shown in FIG. 7. Each of the projections 104 had a height of 3 μm, the total length of each of the projections in the direction perpendicular to its adjacent bank 103 was 40 μm, and the total length of each of the projections in the direction horizontal to its adjacent bank 103 was 40 μm. In addition, four projections were formed in a region surrounded by the adjacent stripe-shaped banks 103 and adjacent pixels so as to serve as one unit. A width between the adjacent projections 104 was 20 μm.

Example 4

An organic EL device was produced in the same manner as that described above except that only the pattern of the projections 104 of Example 1 was changed as shown in FIG. 8. Each of the projections 104 had a height of 3 μm, the total length of each of the projections in the direction perpendicular to its adjacent bank 103 was 140 μm, and the total length of each of the projections in the direction horizontal to its adjacent bank 103 was 70 μm. In addition, the projections were formed only at the start edge portions and end edge portions of the stripe-shaped banks 103.

Comparative Example

Meanwhile, an organic EL device was produced as a comparative example as follows: a substrate for an organic EL device free of the projections 104 was produced with a mask free of a pattern for forming the projections 104, and an organic EL material was applied in the same manner as in Example 1.

(Evaluation)

The organic EL devices in Examples and the organic EL device in Comparative Example were compared with one another in terms of a ratio of lines on which a film could not be formed from a liquid organic EL material owing to the occurrence of the withdrawal of the material to 100 lines and a ratio of lines on which the partial withdrawal of the material occurred to the 100 lines. In addition, the thicknesses of each of the devices were measured at plural arbitrary points, and thickness unevenness with respect to the average thickness of the points was measured. Table 1 below shows the results.

TABLE 1

| | Ratio of lines on which film could not be formed from liquid organic EL material (%) | Ratio of lines on which partial withdrawal of liquid organic EL material occurred (%) | Average thickness (nm) | Thickness unevenness (±%) |
|---|---|---|---|---|
| Example 1 | 0 | 1 | 102 | 7.1 |
| Example 2 | 0 | 0 | 99 | 6.6 |
| Example 3 | 0 | 0 | 103 | 5.8 |
| Example 4 | 0 | 2 | 100 | 5.4 |
| Comparative Example | 4 | 2 | 101 | 5.6 |

As is apparent from Table 1, in each of Examples of the present invention, a phenomenon in which a film could not be formed from a liquid organic EL material on one entire line did not occur, and no partial withdrawal of the material occurred in each of Examples 2 and 3. In addition, thickness unevenness obtained in each of Examples 3 and 4 was comparable to that in the case where no projections were provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-206050, filed Aug. 8, 2007, which is hereby incorporated by reference herein in its entirety.

What is claimed is:

1. A substrate for an organic electroluminescence device comprising:
   a lower electrode constituting a plurality of emission portions; and
   a plurality of banks which are long in one direction and which are provided between each of the emission portions,
   wherein the plurality of emission portions are provided between a first bank and a second bank, the first bank and the second bank being arranged in a stripe-shape; and
   wherein a plurality of projections are provided between each of the plurality of emission portions and wherein the projections are provided independently of the banks and between the first bank and the second bank and throughout the length of the banks.

2. The substrate for an organic electroluminescence device according to claim 1, wherein the projections are each formed of the same material as a material for each of the banks.

3. The substrate for an organic electroluminescence device according to claim 1, wherein a width of each of the projections is 90% or less of a width between the stripe-shaped banks.

4. The substrate for an organic electroluminescence device according to claim 1, wherein a height of each of the projections is equal to or lower than a height of each of the banks.

5. The substrate for an organic electroluminescence device according to claim 1, wherein a side surface of each of the projections comprises a curved surface.

6. The substrate for an organic electroluminescence device according to claim 1, wherein the projections are respectively formed between the plurality of emission portions.

7. A display apparatus comprising:
   a plurality of organic electroluminescence devices; and
   a plurality of banks which are long in one direction and which are provided between each of the organic electroluminescence devices,
   wherein the plurality of organic electroluminescence devices are provided between a first bank and a second bank, the first bank and the second bank being arranged in a stripe-shape; and
   wherein a plurality of projections are provided between each of the plurality of organic electroluminescence devices and wherein the projections are provided independently of the banks and between the first bank and the second bank and throughout the length of the banks.

* * * * *